United States Patent
Nishioka et al.

(10) Patent No.: US 10,734,789 B2
(45) Date of Patent: Aug. 4, 2020

(54) LIGHT EMITTING DEVICE AND PROJECTOR

(71) Applicants: Seiko Epson Corporation, Tokyo (JP); Sophia School Corporation, Tokyo (JP)

(72) Inventors: Hiroki Nishioka, Kita (JP); Katsumi Kishino, Akiruno (JP)

(73) Assignees: Seiko Epson Corporation (JP); Sophia School Corporation (JP)

( * ) Notice: Subject to any disclaimer, the term of this patent is extended or adjusted under 35 U.S.C. 154(b) by 0 days.

(21) Appl. No.: 16/531,266

(22) Filed: Aug. 5, 2019

(65) Prior Publication Data
US 2020/0044418 A1    Feb. 6, 2020

(30) Foreign Application Priority Data

Aug. 6, 2018  (JP) ................. 2018-147680

(51) Int. Cl.
| | | |
|---|---|---|
| *H01S 5/343* | (2006.01) | |
| *G03B 21/20* | (2006.01) | |
| *G03B 33/12* | (2006.01) | |

(52) U.S. Cl.
CPC ...... *H01S 5/34346* (2013.01); *G03B 21/2033* (2013.01); *H01S 5/34333* (2013.01); *G03B 21/2013* (2013.01); *G03B 33/12* (2013.01)

(58) Field of Classification Search
CPC ........ H01S 5/12; H01S 5/1206; H01S 5/1215; H01S 5/40; H01S 5/4031; H01S 5/4093;
(Continued)

(56) References Cited

U.S. PATENT DOCUMENTS

| | | |
|---|---|---|
| 2006/0284187 A1 | 12/2006 | Wierer et al. |
| 2007/0177647 A1 | 8/2007 | Noda et al. |

(Continued)

FOREIGN PATENT DOCUMENTS

| | | |
|---|---|---|
| JP | 2013-009002 A | 1/2013 |
| JP | 2014-027009 A | 2/2014 |

(Continued)

OTHER PUBLICATIONS

Y. Matsui et al., "Fabricated Cluster Array Nanocolumn Photonic Crystals", Conference Proceedings of the Japan Society of Applied Physics Autumn Meeting, No. 77, 16p-A21-2, 5 pages including translation (2016).

(Continued)

*Primary Examiner* — Armando Rodriguez
(74) *Attorney, Agent, or Firm* — Harness, Dickey & Pierce, P.L.C.

(57) ABSTRACT

A light emitting device includes a substrate, and a stacked body provided to the substrate, and including a columnar part aggregate constituted by p columnar parts, wherein the stacked body includes a plurality of the columnar part aggregates, the p columnar parts each have a light emitting layer, a diagram configured by respective centers of the plurality of columnar parts has rotation symmetry when viewed from a stacking direction of the stacked body, a diametrical size of q columnar parts out of the p columnar parts is different from a diametrical size of r columnar parts out of the p columnar parts, a shape of the columnar part aggregate is not rotation symmetry, the p is an integer not less than 2, the q is an integer not less than 1 and less than the p, and the r is an integer satisfying r=p−q.

4 Claims, 7 Drawing Sheets

(58) Field of Classification Search
CPC ............. H01S 5/34346; H01S 5/34333; G03B 21/2033; G03B 21/2013; G03B 33/12
See application file for complete search history.

(56) References Cited

U.S. PATENT DOCUMENTS

2016/0254138 A1* 9/2016 Kikuchi ............ H01L 21/02458
 438/507
2017/0271849 A1 9/2017 Saito et al.

FOREIGN PATENT DOCUMENTS

JP 2017-168594 A 9/2017
WO WO-2005-086302 A1 9/2005

OTHER PUBLICATIONS

Y. Liang et al., "Three-dimensional coupled-wave analysis for square-lattice photonic crystal surface emitting lasers with transverse-electric polarization: finite size effects", Optics Express, vol. 20, No. 14, pp. 15945-15961 (2012).

* cited by examiner ness of a light source for a projector. In a projector
LIGHT EMITTING DEVICE AND PROJECTOR The present application is based on, and claims priority from, JP Application Serial Number 2018-147680, filed Aug. 6, 2018, the disclosure of which is hereby incorporated by reference herein in its entirety.

BACKGROUND

1. Technical Field

The present disclosure relates to a light emitting device and a projector.

2. Related Art

A semiconductor laser is promising as a high-luminance next-generation light source. In particular, a semiconductor laser to which nano-columns are applied is expected to be able to realize narrow-radiation angle high-power light emission due to an effect of a photonic crystal derived from the nano-columns. Such a semiconductor laser is applied as, for example, a light source for a projector. In a projector using a liquid crystal light valve, it is desirable for the light emitted from a light source to be linearly polarized light.

In the semiconductor laser using the photonic crystal of GaN type nano-columns, it is possible to achieve designs corresponding respectively to the wavelengths of the three primary colors of RGB by changing the arrangement pitch and the diameter of the nano-columns. It should be noted that in order to oscillate in a red region, it is necessary to use the nano-columns large in diameter, and it is difficult to obtain the advantage of the nano-columns that there are few defects and little distortion, and the luminous efficiency is high. Therefore, there has been known a technology of periodically arranging nano-column aggregates each constituted by a plurality of nano-columns small in diameter assuming the nano-column aggregate as a nano-column.

Here, since the nano-columns are arranged in a lattice pattern having rotation symmetry such as a triangle, a square or a hexagon as described in JP-A-2013-9002, the light emitted from the light emitting device is not linearly polarized light.

Even when forming the nano-column aggregate using a plurality of nano-columns as described above, when the nano-column aggregates are arranged in the lattice pattern having the rotation symmetry, the light emitted from the light emitting device is not the linearly polarized light.

SUMMARY

A light emitting device according to an aspect of the present disclosure includes a substrate, and a stacked body provided to the substrate, and including a columnar part aggregate constituted by p columnar parts, wherein the stacked body includes a plurality of the columnar part aggregates, the p columnar parts each have a light emitting layer, a diagram configured by respective centers of the p columnar parts has rotation symmetry and a shape of the columnar part aggregate is not rotation symmetry, when viewed from a stacking direction of the stacked body, a diametrical size of q columnar parts out of the p columnar parts is different from a diametrical size of r columnar parts out of the p columnar parts, the p is an integer not less than 2, the q is an integer not less than 1 and less than the p, and the r is an integer satisfying r=p−q.

A light emitting device according to another aspect of the present disclosure includes a substrate, and a stacked body provided to the substrate, and including a columnar part aggregate constituted by p columnar parts, wherein the stacked body includes a plurality of the columnar part aggregates, the p columnar parts each have a light emitting layer, when defining the p lattice points having rotation symmetry on the substrate, respective centers of q columnar parts out of the p columnar parts are disposed at the lattice points, and respective centers of r columnar parts out of the p columnar parts are disposed at positions different from the lattice points, a shape of the columnar part aggregate is not rotation symmetry, when viewed from a stacking direction of the stacked body, the p is an integer not less than 3, the q is an integer not less than 2 and less than the p, and the r is an integer satisfying r=p−q.

In the light emitting device according to the above aspect, the q may be an integer larger than a half of the p.

A projector according to another aspect of the present disclosure includes the light emitting device according to one of the above aspects.

DESCRIPTION OF EXEMPLARY EMBODIMENTS

Some preferred embodiments of the present disclosure will hereinafter be described in detail using the accompanying drawings. It should be noted that the embodiments described below do not unreasonably limit the contents of the present disclosure as set forth in the appended claims.

Further, all of the constituents described hereinafter are not necessarily essential elements of the present disclosure.

1. First Embodiment

1.1. Light Emitting Device

Figure 1:
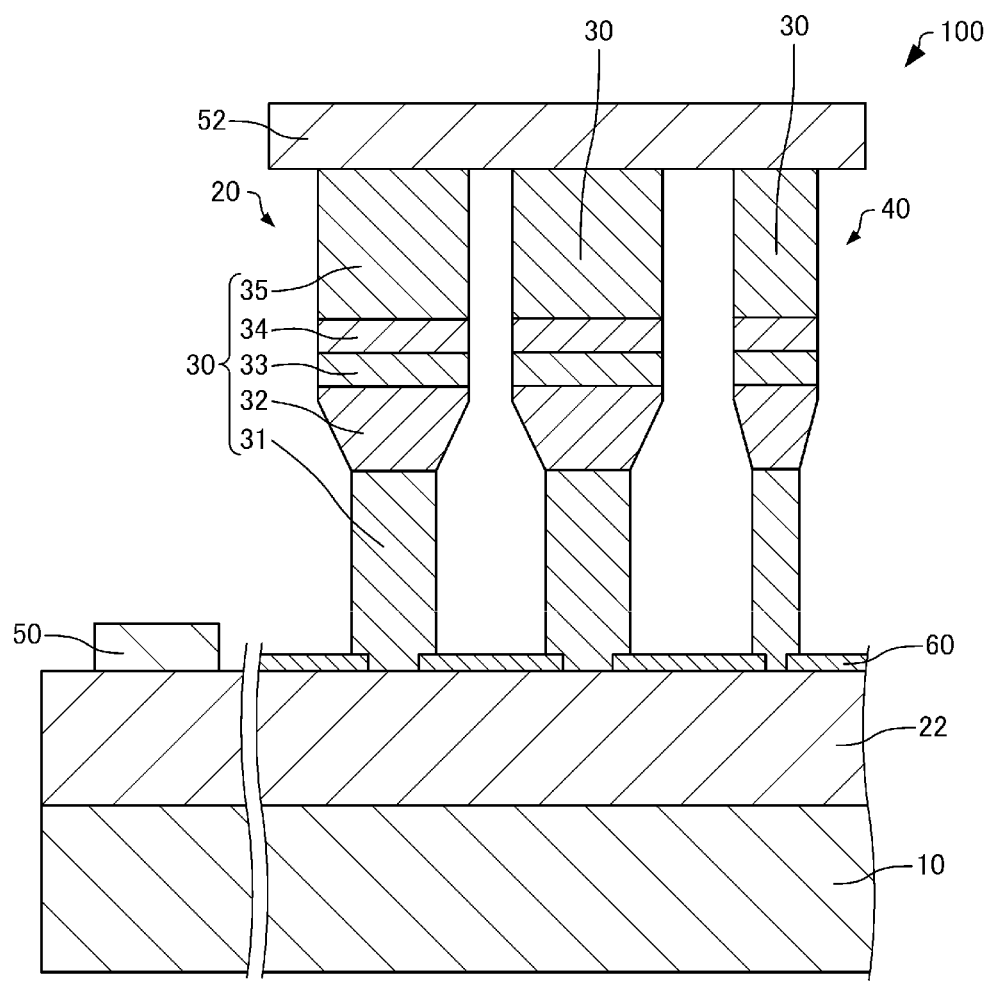
FIG. 1 is a cross-sectional view schematically showing a light emitting device according to a first embodiment.
Figure 2:
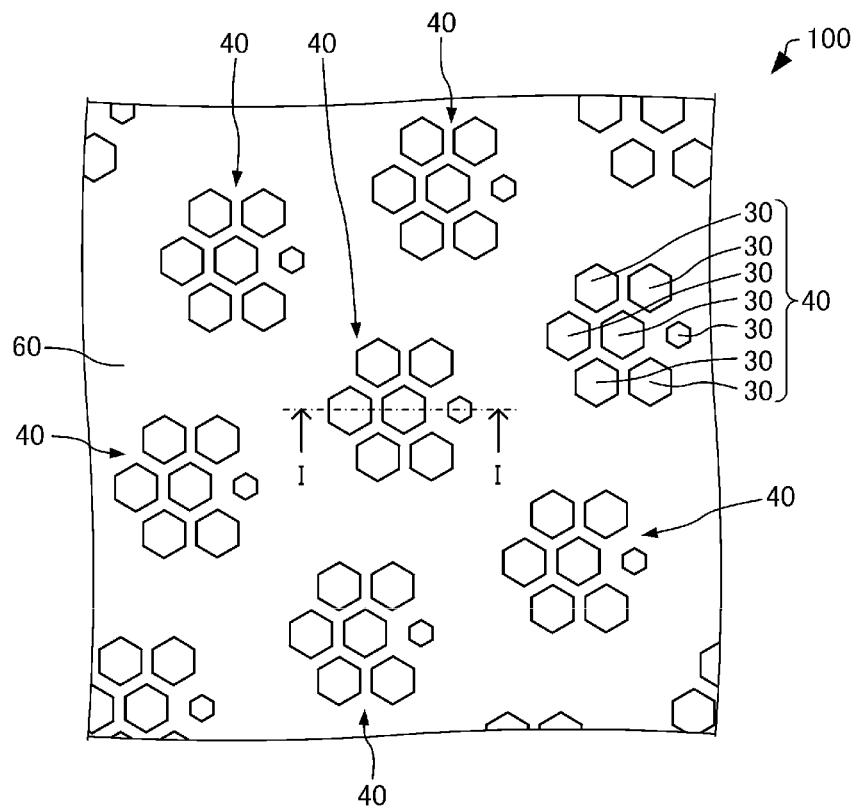
FIG. 2 is a plan view schematically showing the light emitting device according to the first embodiment.

Firstly, a light emitting device according to a first embodiment will be described with reference to the accompanying drawings. FIG. 1 is a cross-sectional view schematically showing the light emitting device 100 according to the first embodiment. FIG. 2 is a plan view schematically showing the light emitting device 100 according to the first embodiment. It should be noted that FIG. 1 is a cross-sectional view along the line I-I shown in FIG. 2.

As shown in FIG. 1 and FIG. 2, the light emitting device 100 includes a substrate 10, a stacked body 20, a first electrode 50 and a second electrode 52. It should be noted that in FIG. 2, illustration of the second electrode 52 is omitted for the sake of convenience.

The substrate 10 has, for example, a plate-like shape. The substrate 10 is, for example, an Si substrate, a GaN substrate or a sapphire substrate.

The stacked body 20 is provided to the substrate 10. In the illustrated example, the stacked body 20 is disposed on the substrate 10. The stacked body 20 has, for example, a buffer layer 22 and columnar parts 30.

It should be noted that in the present disclosure, "upper" denotes a direction of getting away from the substrate 10 viewed from a light emitting layer 33 of the columnar part 30 in a stacking direction of the stacked body 20 (hereinafter also referred to simply as the "stacking direction"), and "lower" denotes a direction of getting closer to the substrate 10 viewed from the light emitting layer 33 in the stacking direction.

Further, in the present disclosure, the "stacking direction of the stacked body 20" denotes a stacking direction of a first semiconductor layer 31 and the light emitting layer 33 of the columnar part 30.

The buffer layer 22 is disposed on the substrate 10 and the buffer layer 22 is located on the upper side of the substrate 10. The buffer layer 22 is, for example, an Si-doped n-type GaN layer. On the buffer layer 22, there is disposed a mask layer 60 for forming the columnar sections 30.

The columnar sections 30 are disposed on the buffer layer 22. A cross-sectional shape in a direction perpendicular to the stacking direction of the columnar part 30 is, for example, a polygon or a circle. In the example shown in FIG. 2, the cross-sectional shape of the columnar part 30 is a regular hexagon. The diametrical size of the columnar part 30 is, for example, in an nm-order range, and specifically not smaller than 10 nm and not larger than 500 nm. The columnar part 30 is also referred to as, for example, a nano-column, a nano-wire, a nano-rod or a nano-pillar. The size in the stacking direction of the columnar part 30 is, for example, not smaller than 0.1 µm and not larger than 5 µm.

It should be noted that in the present disclosure, when the planar shape of the columnar part 30 is a circle, the "diametrical size" denotes the diameter, and when the planar shape of the columnar part 30 is a polygon, the "diametrical size" denotes the diameter of the minimum circle including the polygon inside, namely the minimum enclosing circle. Further, the "planar shape" denotes a shape viewed from the stacking direction.

As shown in FIG. 1, the columnar parts 30 each include a first semiconductor layer 31, a first guide layer 32, the light emitting layer 33, a second guide layer 34 and a second semiconductor layer 35.

The first semiconductor layer 31 is disposed on the buffer layer 22. The first semiconductor layer 31 is disposed between the substrate 10 and the light emitting layer 33. The first semiconductor layer 31 is, for example, an Si-doped n-type GaN layer.

The first guide layer 32 is disposed on the first semiconductor layer 31. The first guide layer 32 has a larger diametrical size than the diametrical size of the first semiconductor layer 31. In the illustrated example, the diametrical size of the first guide layer 32 varies in the stacking direction. The first guide layer 32 has a semiconductor superlattice (SL) structure constituted by, for example, at least one GaN layer and at least one InGaN layer. The number of the GaN layers and the number of the InGaN layers constituting the first guide layer 32 are not particularly limited.

The light emitting layer 33 is disposed on the first guide layer 32. The light emitting layer 33 is disposed between the first semiconductor layer 31 and the second semiconductor layers 35. The light emitting layer 33 is a layer capable of emitting light in response to injection of an electrical current. The light emitting layer 33 has multi quantum well (MQW) structure constituted by, for example, at least one GaN layer and at least one InGaN layer. The number of the GaN layers and the number of the InGaN layers constituting the light emitting layer 33 are not particularly limited.

The second guide layer 34 is disposed on the light emitting layer 33. The second guide layer 34 has a semiconductor superlattice (SL) structure constituted by, for example, at least one GaN layer and at least one InGaN layer. The number of the GaN layers and the number of the InGaN layers constituting the second guide layer 34 are not particularly limited. The first guide layer 32 and the second guide layer 34 are layers having a function of increasing overlapping between the light emitting layer 33 and light propagating in a direction perpendicular to the stacking direction, namely increasing the light confinement factor.

The second semiconductor layer 35 is disposed on the second guide layer 34. The second semiconductor layer 35 is a layer different in conductivity type from the first semiconductor layer 31. The second semiconductor layer 35 is, for example, an Mg-doped p-type GaN layer. The first semiconductor layer 31 and the second semiconductor layer 35 are cladding layers having a function of confining the light in the light emitting layer 33.

In the light emitting device 100, a pin diode is constituted by the p-type second semiconductor layer 35, the light emitting layer 33 and the first and second guide layers 32, 34 doped with no impurity, and the n-type first semiconductor layer 31. In the light emitting device 100, when applying a forward bias voltage of the pin diode between the first electrode 50 and the second electrode 52, an electrical current is injected into the light emitting layer, and recombination of electrons and holes occurs in the light emitting layer 33. The recombination causes emission of light. The light generated in the light emitting layer 33 propagates in a direction perpendicular to the stacking direction due to the first semiconductor layer 31 and the second semiconductor layer 35 to form a standing wave due to the effect of the photonic crystal caused by the plurality of columnar parts 30, and then causes laser oscillation receiving a gain in the light emitting layer 33. Then, the light emitting device 100 emits positive first-order diffracted light and negative first-order diffracted light as a laser beam in the stacking direction.

It should be noted that although not illustrated, it is also possible to dispose a reflecting layer between the substrate 10 and the buffer layer 22, or below the substrate 10. The reflecting layer is, for example, a distributed Bragg reflector (DBR) layer. Due to the reflecting layer, it is possible to reflect the light generated in the light emitting layer 33, and thus, it is possible for the light emitting device 100 to emit the light only from the second electrode 52 side.

The columnar parts 30 constitute the columnar part aggregate 40. As shown in FIG. 2, the stacked body 20 has a plurality of columnar part aggregates 40. In the illustrated example, the plurality of columnar part aggregates 40 is arranged in a triangular lattice pattern. When viewed from the stacking direction, the distance between the centers of the columnar part aggregates 40 adjacent to each other is not less than 250 nm and not more than 350 nm. Here, FIG. 3 is a plan view schematically showing the columnar part aggregate 40.

Figure 3:
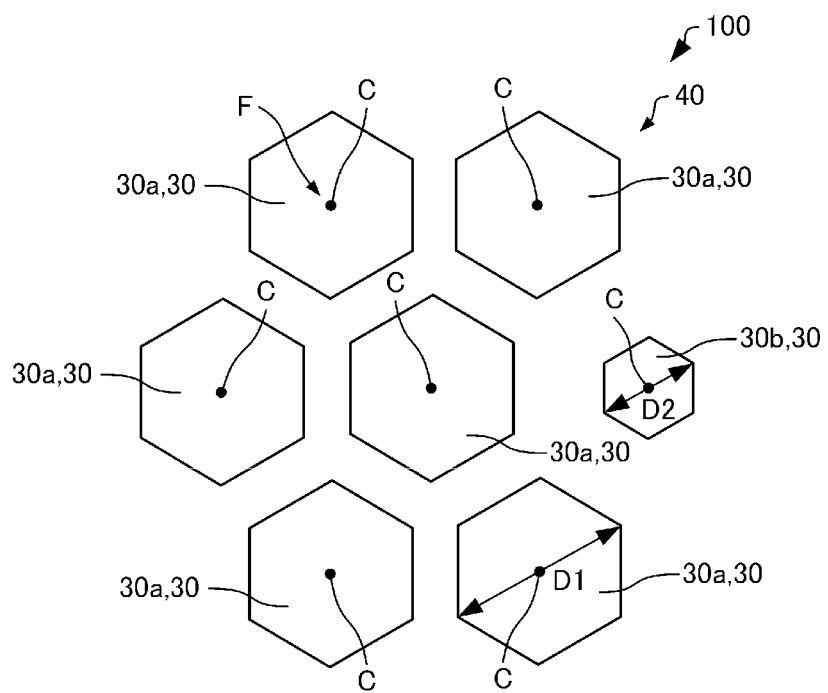
FIG. 3 is a plan view schematically showing a columnar part aggregate of the light emitting device according to the first embodiment.

As shown in FIG. 2 and FIG. 3, the columnar part aggregate 40 is constituted by p columnar parts 30. The number "p" is an integer not smaller than 2, for example, an integer not smaller than 3 and not larger than 15, and preferably an integer not smaller than 3 and not larger than 7. In the illustrated example, "p" is 7, and the columnar part aggregate 40 is constituted by seven columnar parts 30. The columnar part aggregate 40 is an aggregate of the columnar parts 30 each capable of oscillating light in the red region. When viewed from the stacking direction, the distance between the centers of the columnar parts 30 adjacent to each other in the columnar part aggregate 40 is not less than 50 nm and not more than 150 nm. Each of the p columnar parts 30 has the light emitting layer 33.

As shown in FIG. 3, in the columnar part aggregate 40, a diagram F configured by the centers of the respective p columnar parts 30 has, for example, rotation symmetry viewed from the stacking direction. In other words, the diagram F has n-fold symmetry when assuming n as an integer not smaller than 2. In the illustrated example, the diagram F has six-fold symmetry. As described above, since the diagram F configured by, for example, three or more centers C has rotation symmetry, the light resonating in a plurality of directions can more isotropically confined in a direction perpendicular to the stacking direction, and thus it is easy to configure the columnar part aggregate 40 capable of oscillating the light in the red region compared to when the diagram F does not have rotation symmetry, for example, when three or more columnar parts are arranged in a line. For example, since it is possible to form similar refractive index periodic structures in three directions, it is possible to confine the light resonating in the three directions in a similar manner. Therefore, there is no direction in which the light is easily leaked in the three directions in which the resonance occurs, and thus, it is possible to efficiently confine the light. In the illustrated example, the centers C of the columnar parts 30 are disposed at the respective vertexes of the regular hexagon not shown, and the center of the regular hexagon. The center of the regular hexagon overlaps the center of the columnar part aggregate 40. For example, although not illustrated, a diagram constituted by line segments each connecting the centers C adjacent to each other has rotation symmetry.

In the columnar part aggregate 40, the diametrical size D1 of each of q first columnar parts 30a out of the p columnar parts 30 is different from the diametrical size D2 of each of r second columnar parts 30b out of the p columnar parts 30 when viewed from the stacking direction. The diametrical size D2 of the second columnar part 30b is smaller than the diametrical size D1 of the first columnar part 30a. The number "q" is an integer not smaller than 1 and smaller than p. The number "r" is an integer satisfying r=p−q.

In the illustrated example, "q" is 6, and "r" is 1. Since the columnar part aggregate 40 has the second columnar part 30b smaller in diametrical size than the first columnar part 30a, the shape of the columnar part aggregate 40 does not have rotation symmetry when viewed from the stacking direction, in other words, the shape of the columnar part aggregate 40 fails to have rotation symmetry. In other words, when assuming m as an integer not smaller than 2, the shape of the columnar part aggregate 40 does not have m-fold symmetry. The second columnar part 30b is disposed so as not to overlap the center of the columnar part aggregate 40.

Here, the "diametrical size of the columnar part" is the largest one of the diametrical size of the first semiconductor layer 31, the diametrical size of the first guide layer 32, the diametrical size of the light emitting layer 33, the diametrical size of the second guide layer 34 and the diametrical size of the second semiconductor layer 35 of the columnar part 30. In the illustrated example, the diametrical size of the first semiconductor layer 31, the diametrical size of the first guide layer 32, the diametrical size of the light emitting layer 33, the diametrical size of the second guide layer 34 and the diametrical size of the second semiconductor layer of the second columnar part 30b are smaller than the diametrical size of the first semiconductor layer 31, the diametrical size of the first guide layer 32, the diametrical size of the light emitting layer 33, the diametrical size of the second guide layer 34 and the diametrical size of the second semiconductor layer 35 of the first columnar part 30a, respectively. The diametrical size of the light emitting layer 33, the diametrical size of the second guide layer 34 and the diametrical size of the second semiconductor layer 35 are, for example, the same.

It should be noted that although not illustrated, it is also possible for the columnar part aggregate 40 to have a plurality of second columnar parts 30b. It should be noted that when just one second columnar part 30b small in diametrical size is provided, the area where the light propagating in a direction perpendicular to the stacking direction and the light emitting layer 33 overlap each other can be made larger.

The first electrode 50 is disposed on the buffer layer 22. It is also possible for the buffer layer 22 to have ohmic contact with the first electrode 50. The first electrode 50 is electrically coupled to the first semiconductor layer 31. In the illustrated example, the first electrode 50 is electrically coupled to the first semiconductor layer 31 via the buffer layer 22. The first electrode 50 is one of the electrodes for injecting the current into the light emitting layer 33. As the first electrode 50, there can be used, for example, what is obtained by stacking a Ti layer, an Al layer, and an Au layer in this order from the buffer layer 22 side. It should be noted that when the substrate 10 has electrical conductivity, it is also possible for the first electrode 50 to be disposed below the substrate 10 although not illustrated.

The second electrode 52 is disposed on the second semiconductor layer 35. It is also possible for the second semiconductor layer 35 to have ohmic contact with the second electrode 52. The second electrode 52 is electrically coupled to the second semiconductor layer 35. The second electrode 52 is the other of the electrodes for injecting the current into the light emitting layer 33. As the second electrode 52, for example, indium tin oxide (ITO) is used.

It should be noted that although the light emitting layer 33 of the InGaN type is described above, any types of material capable of emitting light in response to injection of an electrical current can be used as the light emitting layer 33 related to the present disclosure. It is possible to use semiconductor materials such as an AlGaN type, an AlGaAs type, an InGaAs type, an InGaAsP type, an InP type, a GaP type or an AlGaP type.

The light emitting device 100 has, for example, the following features.

In the light emitting device 100, the diametrical size D1 of each of q first columnar parts 30a out of the p columnar parts 30 is different from the diametrical size D2 of each of r second columnar parts 30b out of the p columnar parts 30, and therefore, the shape of the columnar part aggregate 40 does not have rotation symmetry. Therefore, the light emitted from the light emitting device 100 is linearly polarized light. Therefore, the light emitting device 100 is preferably used as a light source of a projector using a liquid crystal light valve. Further, it is possible for the light emitting device 100 to emit, for example, monomodal light.

Figure 4:
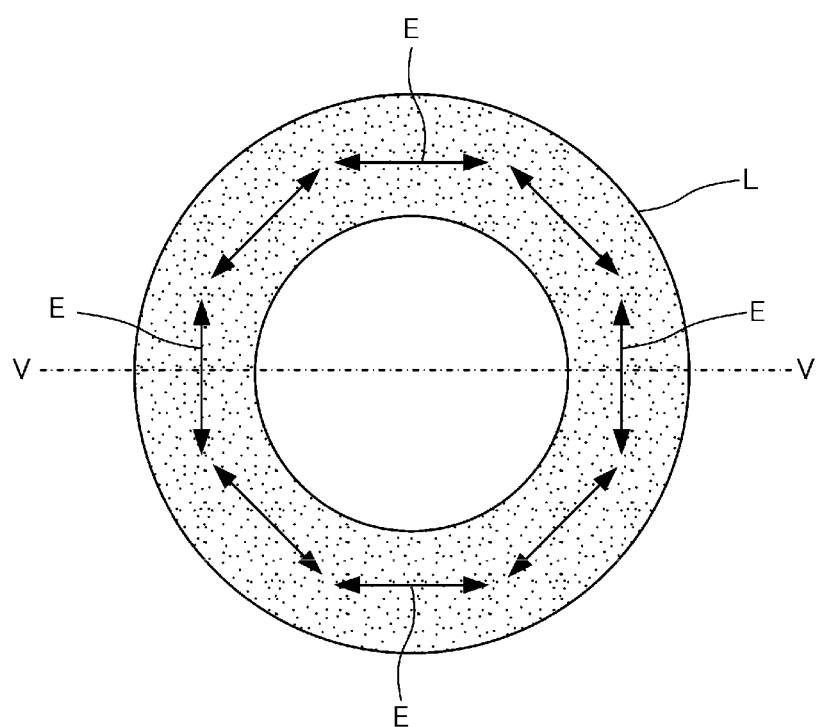
FIG. 4 is a diagram for explaining polarization.
Figure 5:
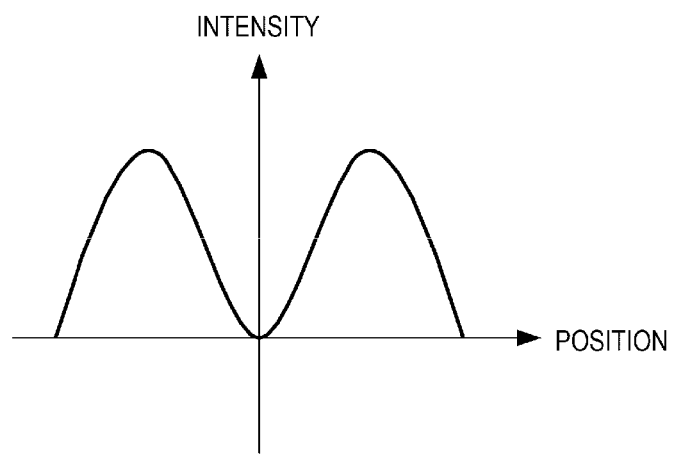
FIG. 5 is a graph for explaining an intensity of light.
Figure 6:
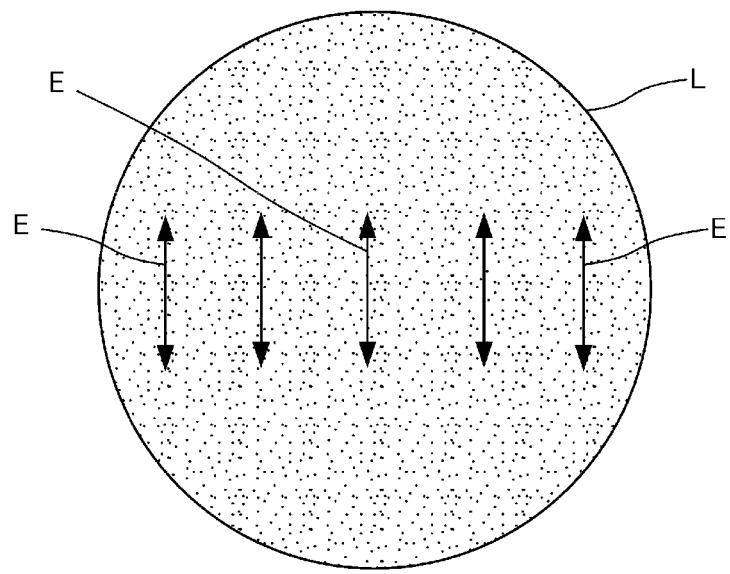
FIG. 6 is a diagram for explaining polarization.

Here, FIG. 4 is a diagram for explaining polarization when the shape of the columnar part aggregate has rotation symmetry. FIG. 5 is a graph for explaining the intensity of the light in the line V-V shown in FIG. 4. FIG. 6 is a diagram for explaining the polarization of the light emitting device 100. When the shape of the columnar part aggregate has rotation symmetry, the vibration directions of the electrical fields E at respective positions of the light L emitted are not uniformed as shown in, for example, FIG. 4, and therefore, in a central part, the electrical fields E are canceled out each other to make the shape of the light L to be emitted, namely the shape of the beam, have a doughnut shape as shown in FIG. 4 and FIG. 5. In contrast, in the light emitting device 100, the vibration directions of the electrical fields E are uniformed as shown in FIG. 6, and therefore, the light emitted from the light emitting device 100 is linearly polarized light. In the example shown in FIG. 6, the shape of the light L to be emitted is a circle. In other words, the light L has monomodality.

Further, in the light emitting device 100, since the diametrical size of the first columnar part 30a is different from the diametrical size of the second columnar part 30b, and therefore, the shape of the columnar part aggregate 40 does not have rotation symmetry, it is difficult for the second electrode 52 to wrap around the side surface of the columnar part 30 compared to when, for example, preventing the shape of the columnar part aggregate from having rotation symmetry by removing one of the columnar parts of the columnar part aggregate having rotation symmetry. Therefore, for example, the leak current is difficult to occur. Further, it is possible to enlarge the area where the light propagating in a direction perpendicular to the stacking direction and the light emitting layer 33 overlap each other.

1.2. Method of Manufacturing Light Emitting Device

Figure 7:
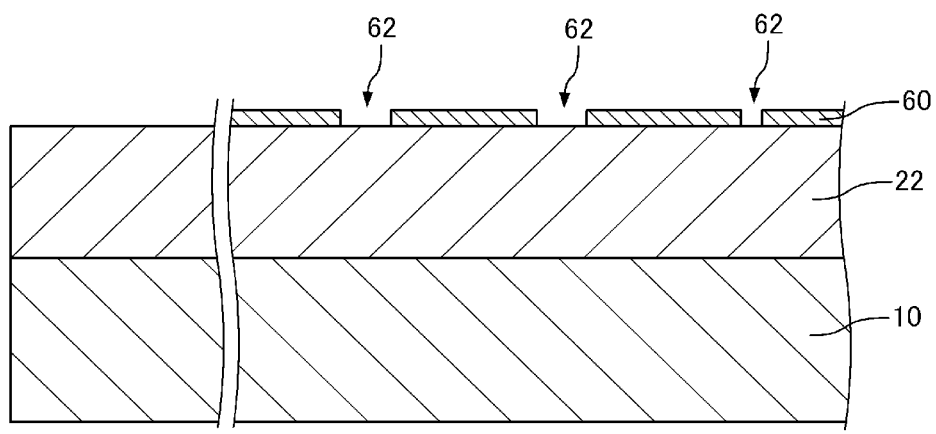
FIG. 7 is a cross-sectional view schematically showing a manufacturing process of the light emitting device according to the first embodiment.

Then, a method of manufacturing the light emitting device 100 according to the first embodiment will be described with reference to the accompanying drawings. FIG. 7 is a cross-sectional view schematically showing a manufacturing process of the light emitting device 100 according to the first embodiment.

As shown in FIG. 7, the buffer layer 22 is grown epitaxially on the substrate 10. As the method of growing the layer epitaxially, there can be cited, for example, the metal organic chemical vapor deposition (MOCVD) method and the molecular beam epitaxy (MBE) method.

Then, the mask layer 60 is formed on the buffer layer 22. The mask layer 60 is formed by deposition using an electron beam deposition method or a plasma chemical vapor deposition (CVD) method, and patterning with a photolithography technique and an etching technique. When viewed from the stacking direction, the area of an aperture 62 for forming the second columnar part 30b of the mask layer 60 is smaller than the area of an aperture 62 for forming the first columnar part 30a of the mask layer 60. Thus, the diametrical size of the second columnar part 30b can be made smaller than the diametrical size of the first columnar part 30a.

As shown in FIG. 1, using the mask layer 60 as a mask, the first semiconductor layer 31, the first guide layer 32, the light emitting layer 33, the second guide layer 34 and the second semiconductor layer 35 are grown epitaxially in this order on the buffer layer 22. As the method of growing the layers epitaxially, there can be cited, for example, the MOCVD method and the MBE method. According to the process described hereinabove, the columnar part aggregate 40 constituted by the plurality of columnar parts 30 can be formed.

Then, the first electrode 50 is formed on the buffer layer 22, and the second electrode 52 is formed on the second semiconductor layer 35. The first electrode 50 and the second electrode 52 are formed using, for example, a vacuum deposition method. It should be noted that the order of forming the first electrode 50 and the second electrode 52 is not particularly limited.

According to the process described hereinabove, the light emitting device 100 can be manufactured.

1.3. Modified Examples of Light Emitting Device 1.3.1. First Modified Example

Figure 8:
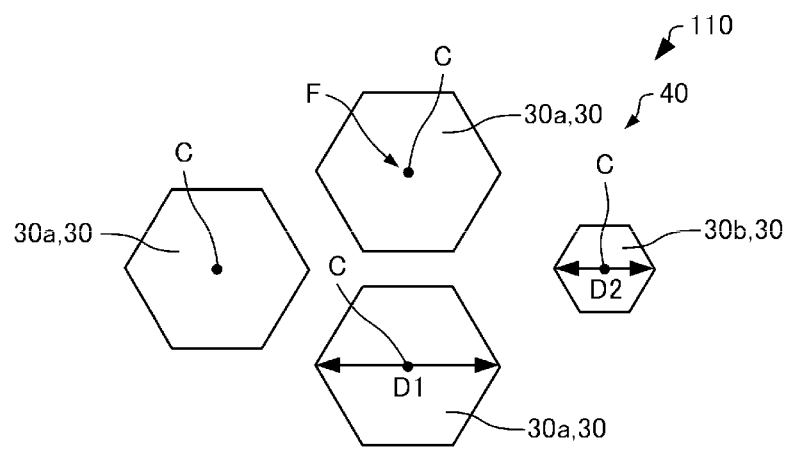
FIG. 8 is a plan view schematically showing a columnar part aggregate of a light emitting device according to a first modified example of the first embodiment.

Then, a light emitting device according to a first modified example of the first embodiment will be described with reference to the accompanying drawings. FIG. 8 is a plan view schematically showing the columnar part aggregate 40 of the light emitting device 110 according to the first modified example of the first embodiment.

Hereinafter, in the light emitting device 110 according to the first modified example of the first embodiment, the points in which the light emitting device 110 is different from the light emitting device 100 according to the first embodiment described above will be described, and the description of the points in which the light emitting devices are substantially the same will be omitted. The same applies to light emitting devices according to second and third modified examples of the first embodiment described later.

In the light emitting device 100 described above, the columnar part aggregate 40 consists of the seven columnar parts 30 as shown in FIG. 3. In contrast, in the light emitting device 110, the columnar part aggregate 40 consists of four columnar parts 30 as shown in FIG. 8. In the illustrated example, the diagram F configured by the centers C of the four columnar parts 30 has two-fold symmetry. The centers C of the columnar parts 30 are disposed at respective vertexes of a rhombus not shown.

1.3.2. Second Modified Example

Figure 9:
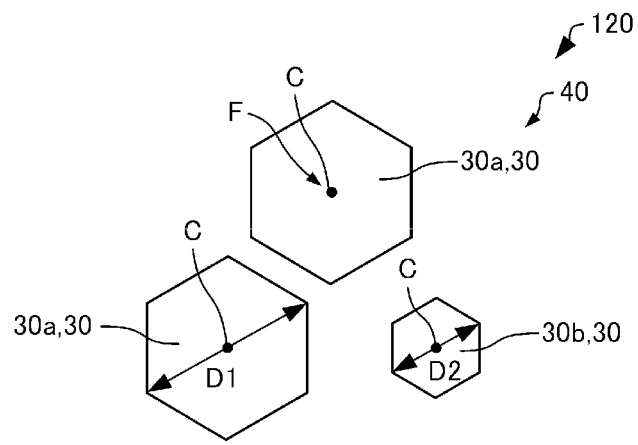
FIG. 9 is a plan view schematically showing a columnar part aggregate of a light emitting device according to a second modified example of the first embodiment.

Then, the light emitting device according to the second modified example of the first embodiment will be described with reference to the accompanying drawings. FIG. 9 is a plan view schematically showing the columnar part aggregate 40 of the light emitting device 120 according to the second modified example of the first embodiment.

In the light emitting device 100 described above, the columnar part aggregate 40 consists of the seven columnar parts 30 as shown in FIG. 3. In contrast, in the light emitting device 120, the columnar part aggregate 40 consists of three columnar parts 30 as shown in FIG. 9. In the illustrated example, the diagram F configured by the centers C of the three columnar parts 30 has three-fold symmetry. The centers C of the columnar parts 30 are disposed at respective vertexes of an equilateral triangle not shown.

It should be noted that the number of the columnar parts constituting the columnar part aggregate according to the present disclosure is not limited to the examples of three, four and seven described above.

1.3.3. Third Modified Example

Figure 10:
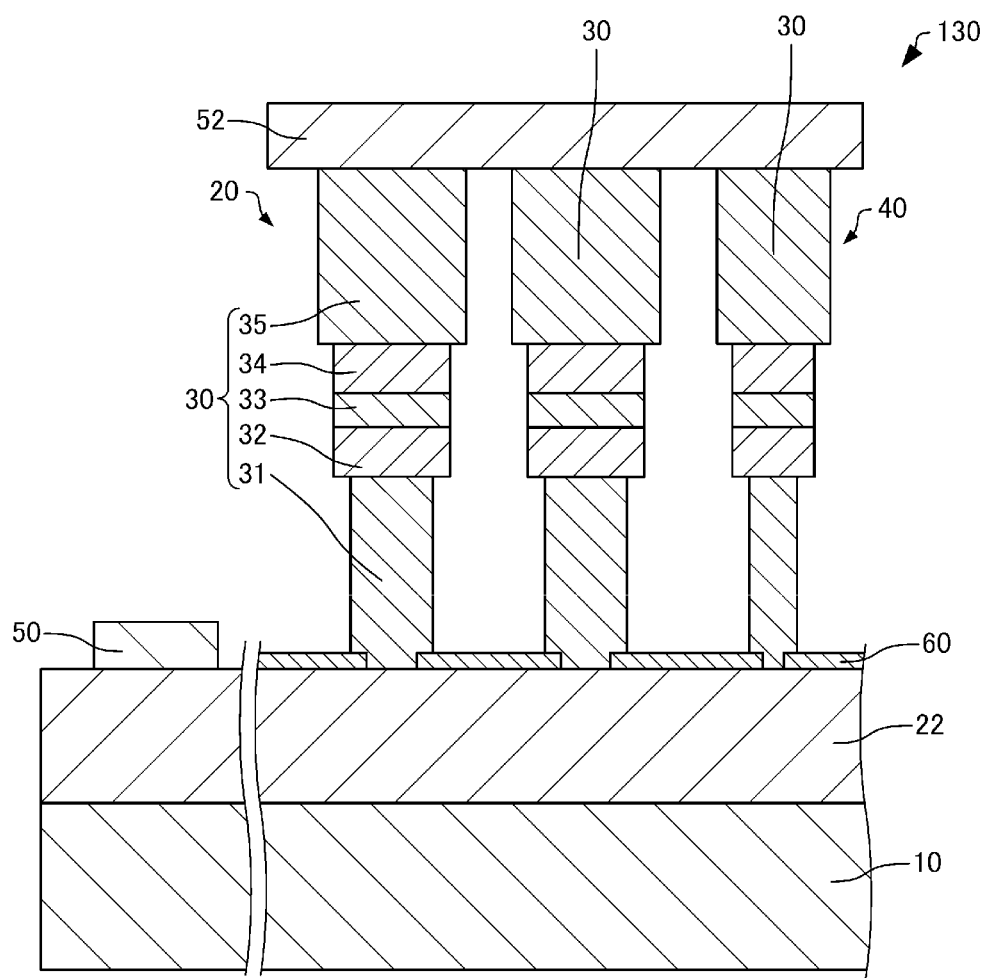
FIG. 10 is a cross-sectional view schematically showing a light emitting device according to a third modified example of the first embodiment.

Then, the light emitting device according to the third modified example of the first embodiment will be described with reference to the accompanying drawings. FIG. 10 is a cross-sectional view schematically showing the light emitting device 130 according to the third modified example of the first embodiment.

As shown in FIG. 1, in the light emitting device 100 described above, the diametrical size of the light emitting layer 33 and the diametrical size of the second semiconductor layer 35 are the same in the columnar part 30. In contrast, in the light emitting device 130, the diametrical size of the second semiconductor layer 35 is larger than the diametrical size of the light emitting layer 33 as shown in FIG. 10.

In the illustrated example, the diametrical size of the first guide layer 32, the diametrical size of the light emitting layer 33 and the diametrical size of the second guide layer 34 are the same. For example, by controlling the growth temperature when epitaxially growing the first guide layer 32, the light emitting layer 33, the second guide layer 34 and the second semiconductor layer 35, it is possible to make the diametrical size of the second semiconductor layer 35 larger than the diametrical size of the first guide layer 32, the diametrical size of the light emitting layer 33 and the diametrical size of the second guide layer 34.

2. Second Embodiment

2.1. Light Emitting Device

Figure 11:
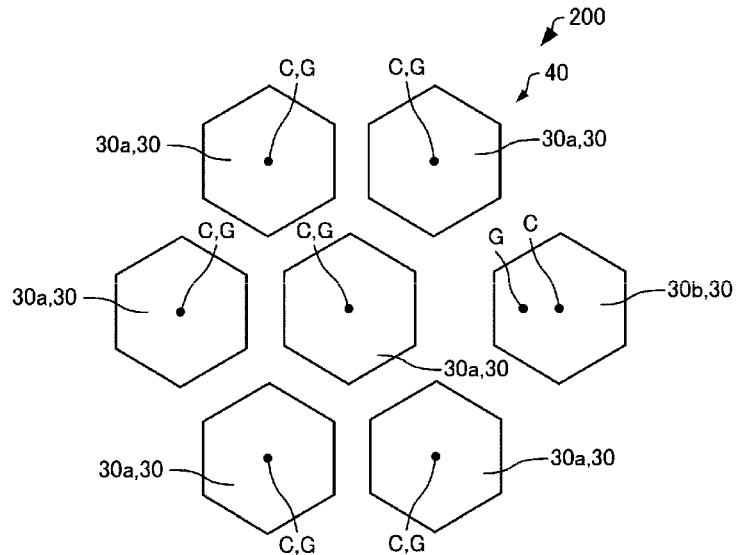
FIG. 11 is a plan view schematically showing a columnar part aggregate of a light emitting device according to a second embodiment.

Then, a light emitting device according to a second embodiment will be described with reference to the accompanying drawings. FIG. 11 is a plan view schematically showing the columnar part aggregate 40 of the light emitting device 200 according to the second embodiment.

Hereinafter, in the light emitting device 200 according to the second embodiment, the points in which the light emitting device 200 is different from the light emitting device 100 according to the first embodiment described above will be described, and the description of the points in which the light emitting devices are substantially the same will be omitted.

As shown in FIG. 3, in the light emitting device 100 described above, the diametrical size D1 of the first columnar part 30*a* is different from the diametrical size D2 of the second columnar part 30*b* when viewed from the stacking direction. In contrast, in the light emitting device 200, for example, the diametrical size of the first columnar part 30*a* is the same as the diametrical size of the second columnar part 30*b* when viewed from the stacking direction as shown in FIG. 11.

The light emitting device 200 has the columnar part aggregates 40 each constituted by the p columnar parts 30. When defining p lattice points G having rotation symmetry in the substrate 10, the respective centers C of the q first columnar parts 30*a* out of the p columnar parts 30 are disposed at the respective lattice points G when viewed from the stacking direction. The respective centers C of the r second columnar parts 30*b* out of the p columnar parts 30 are disposed at points different from the lattice points G. The lattice points G are imaginary points defined on the substrate 10 when viewed from the stacking direction. The number "p" is an integer not smaller than 3. The number "q" is an integer not smaller than 2 and smaller than p, and is, for example, an integer larger than a half of "p." The number "r" is an integer satisfying r=p−q.

In the illustrated example, "p" is 7, "q" is 6, and "r" is 1. The diagram configured by the p lattice points G has six-fold symmetry. The lattice points G are disposed at the respective vertexes of a regular hexagon not shown, and the center of the regular hexagon. The distance between the center C of the second columnar part 30*b* and the lattice point G the closest to the center C of the second columnar part 30*b* is, for example, not less than 5 nm and not more than 25 nm.

Since the columnar part aggregate 40 has the second columnar part 30*b* provided with the center C different in position from the lattice point G, the shape of the columnar part aggregate 40 does not have rotation symmetry when viewed from the stacking direction.

The light emitting device 200 has, for example, the following features.

In the light emitting device 200, when defining the p lattice points G having rotation symmetry on the substrate 10, the respective centers C of the q first columnar parts 30*a* out of the p columnar parts 30 are disposed at the lattice points G, and the respective centers C of the r second columnar parts 30*b* out of the p columnar parts 30 are disposed at positions different from the lattice points G when viewed from the stacking direction, and thus, the shape of the columnar part aggregate does not have rotation symmetry. Therefore, the light emitted from the light emitting device 200 is linearly polarized light similarly to the light emitting device 100. Further, since the light emitting device 200 has the second columnar part 30*b* provided with the center C different in position from the lattice point G, the shape of the columnar part aggregate 40 does not have rotation symmetry. Therefore, it is possible to enlarge the area where the light propagating in a direction perpendicular to the stacking direction and the light emitting layer 33 overlap each other compared to when, for example, making the diametrical size of the first columnar part 30*a* different from the diametrical size of the second columnar part 30*b* to prevent the shape of the columnar part aggregate 40 from having rotation symmetry.

In the light emitting device 200, "q" is an integer larger than a half of "p." Therefore, the columnar parts 30 larger in number than a half of the p columnar parts 30 can be disposed at the lattice points G. Thus, in the light emitting device 200, the light resonating in a plurality of directions can more isotropically confined, for example, in a direction perpendicular to the stacking direction, and thus it is easy to configure the columnar part aggregate 40 capable of oscillating the light in the red region compared to when the columnar parts larger in number than a half of the p columnar parts 30 are not disposed at the lattice points G. In the light emitting device 200, for example, since it is possible to form similar refractive index periodic structures in a plurality of directions, it is possible to confine the light resonating in a plurality of directions in a similar manner, and thus the confinement of the light becomes advantageous.

2.2. Method of Manufacturing Light Emitting Device

Then, a method of manufacturing the light emitting device 200 according to the second embodiment will be described. The method of manufacturing the light emitting device 200 according to the second embodiment is basically the same as the method of manufacturing the light emitting device 100 according to the first embodiment described above. Therefore, the detailed description thereof will be omitted.

Figure 12:
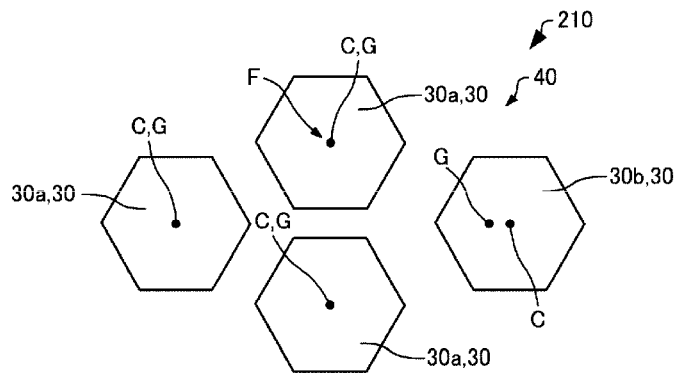
FIG. 12 is a plan view schematically showing a columnar part aggregate of a light emitting device according to a first modified example of the second embodiment.

2.3. Modified Examples of Light Emitting Device
2.3.1. First Modified Example Then, a light emitting device according to a first modified example of the second embodiment will be described with reference to the accompanying drawings. FIG. 12 is a plan view schematically showing the columnar part aggregate 40 of the light emitting device 210 according to the first modified example of the second embodiment.

Hereinafter, in the light emitting device 210 according to the first modified example of the second embodiment, the points in which the light emitting device 210 is different from the light emitting device 200 according to the second embodiment described above will be described, and the description of the points in which the light emitting devices are substantially the same will be omitted. The same applies to a light emitting device according to a second modified example of the second embodiment described later.

In the light emitting device 200 described above, the columnar part aggregate 40 consists of the seven columnar parts 30 as shown in FIG. 11. In contrast, in the light emitting device 210, the columnar part aggregate 40 consists of four columnar parts 30 as shown in FIG. 12. In the illustrated example, the lattice points G are disposed at respective vertexes of a rhombus not shown.

2.3.2. Second Modified Example

Figure 13:
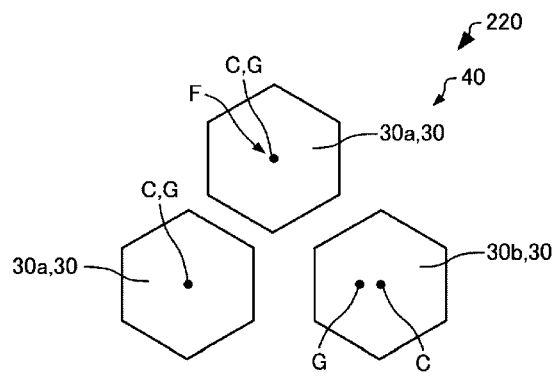
FIG. 13 is a plan view schematically showing a columnar part aggregate of a light emitting device according to a second modified example of the second embodiment.

Then, the light emitting device according to the second modified example of the second embodiment will be described with reference to the accompanying drawings. FIG. 13 is a plan view schematically showing the columnar part aggregate 40 of the light emitting device 220 according to the second modified example of the second embodiment.

In the light emitting device 200 described above, the columnar part aggregate 40 consists of the seven columnar parts 30 as shown in FIG. 11. In contrast, in the light emitting device 220, the columnar part aggregate 40 consists of three columnar parts 30 as shown in FIG. 13. In the illustrated example, the lattice points G are disposed at respective vertexes of an equilateral triangle not shown.

3. Third Embodiment

Figure 14:
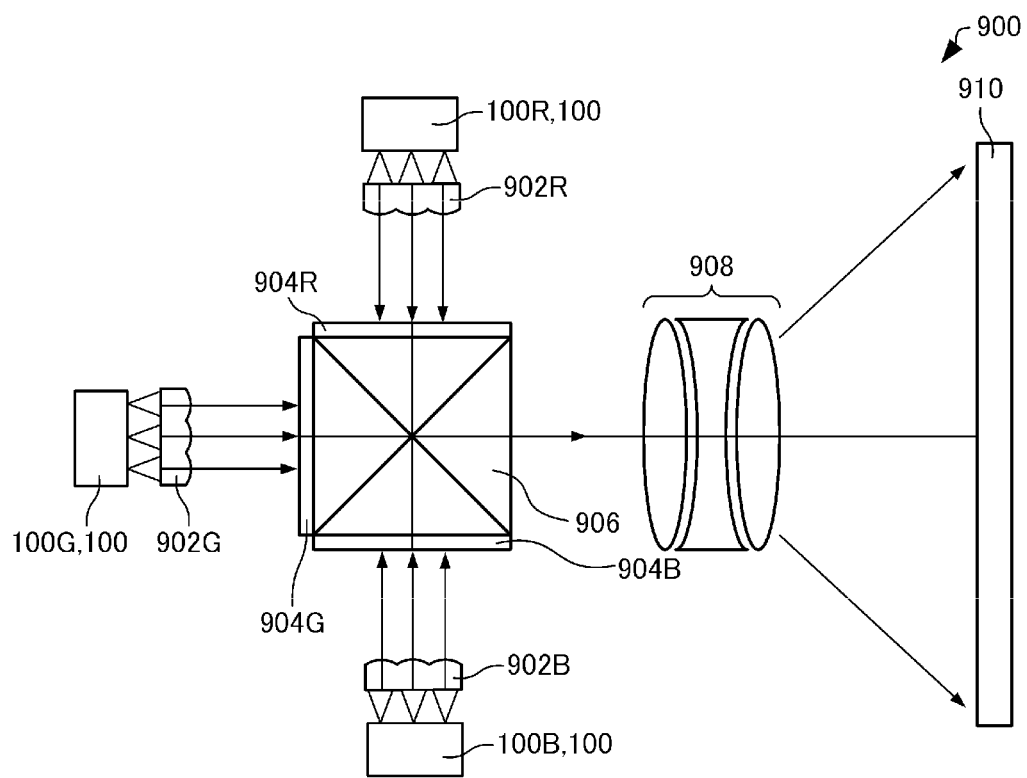
FIG. 14 is a diagram schematically showing a projector according to a third embodiment.

Then, a projector according to a third embodiment will be described with reference to the accompanying drawings. FIG. 14 is a diagram schematically showing the projector 900 according to the third embodiment.

The projector according to the present disclosure includes the light emitting device according to the present disclosure. Hereinafter, the projector 900 including the light emitting device 100 as the light emitting device according to the present disclosure will be described.

The projector 900 includes a housing not shown, a red light source 100R, a green light source 100G and a blue light source 100B provided in the housing and respectively emitting red light, green light and blue light. Each of the red light source 100R, the green light source 100G and the blue light source 100B has a plurality of light emitting devices 100 arranged in an array in a direction perpendicular to the stacking direction, wherein a common substrate is used in common in the plurality of light emitting devices 100 as the respective substrates 10. The number of the light emitting devices 100 constituting each of the red light source 100R, the green light source 100G and the blue light source 100B is not particularly limited. It should be noted that in FIG. 14, the red light source 100R, the green light source 100G and the blue light source 100B are simplified for the sake of convenience.

The projector 900 further includes a first lens array 902R, a second lens array 902G, a third lens array 902B, a first light modulation device 904R, a second light modulation device 904G, the third light modulation device 904B and a projection device 908 all disposed inside the housing. The first light modulation device 904R, the second light modulation device 904G and the third light modulation device 904B are each, for example, a transmissive liquid crystal light valve. The projection device 908 is, for example, a projection lens.

The light emitted from the red light source 100R enters the first lens array 902R. The light emitted from the red light source 100R can be collected and, for example, superimposed with each other by the first lens array 902R.

The light collected by the first lens array 902R enters the first light modulation device 904R. The first light modulation device 904R modulates the incident light in accordance with image information. Then, the projection device 908 projects the image formed by the first light modulation device 904R on a screen 910 in an enlarged manner.

The light emitted from the green light source 100G enters the second lens array 902G. The light emitted from the green light source 100G can be collected and, for example, superimposed with each other by the second lens array 902G.

The light collected by the second lens array 902G enters the second light modulation device 904G. The second light modulation device 904G modulates the incident light in accordance with the image information. Then, the projection device 908 projects the image formed by the second light modulation device 904G on the screen 910 in an enlarged manner.

The light emitted from the blue light source 100B enters the third lens array 902B. The light emitted from the blue light source 100B can be collected and, for example, superimposed with each other by the third lens array 902B.

The light collected by the third lens array 902B enters the third light modulation device 904B. The third light modulation device 904B modulates the incident light in accordance with the image information. Then, the projection device 908 projects the image formed by the third light modulation device 904B on the screen 910 in an enlarged manner.

Further, the projector 900 may include a cross dichroic prism 906 for combining the light emitted from the first light modulation device 904R, the light emitted from the second light modulation device 904G and the light emitted from the third light modulation device 904B with each other to guide the light thus combined to the projection device 908.

The three colors of light respectively modulated by the first light modulation device 904R, the second light modulation device 904G and the third light modulation device 904B enter the cross dichroic prism 906. The cross dichroic prism 906 is formed by bonding four rectangular prisms to each other, and is provided with a dielectric multilayer film for reflecting the red light and a dielectric multilayer film for reflecting the blue light disposed on the inside surfaces so as to form a crisscross. The three colors of light are combined with each other by these dielectric multilayer films, and thus, the light representing a color image is formed. Then, the light thus combined is projected on the screen 910 by the projection device 908, and thus an enlarged image is displayed.

In the projector 900, there are included the light emitting devices 100 each capable of emitting the light as the linearly polarized light. Therefore, in the projector 900, the control of transmitting and blocking the light can more reliably be performed in the first light modulation device 904R, the second light modulation device 904G and the third light modulation device 904B.

The light emitting device according to the present disclosure is not limited to the application of the embodiment described above, but can be used in other applications than the projector. As the applications other than the projector, there can be cited, for example, indoor and outdoor illumination, a backlight for a display, a laser printer, a scanner, an in-car light, sensing equipment using light and a light source of communication equipment and so on.

The present disclosure can be implemented with some of the constituents omitted, or combining any of the embodiments and the modified examples with each other within a range in which the features and the advantages described in the specification are provided.

The present disclosure is not limited to the embodiments described above, but can further variously be modified. For example, the present disclosure includes substantially the same configuration as the configurations described in the embodiments. Substantially the same configuration denotes a configuration substantially the same in, for example, function, way and result, or a configuration substantially the same in object and advantage. Further, the present disclosure includes configurations obtained by replacing a non-essential part of the configuration explained in the above description of the embodiments. Further, the present disclosure includes configurations providing the same functions and the same advantage, or configurations capable of achieving the same object as the configuration explained in the description of the embodiments. Further, the present disclosure includes configurations obtained by adding a known technology to the configuration explained in the description of the embodiments.

What is claimed is:

1. A light emitting device comprising:
a substrate; and
a stacked body provided to the substrate, and including a columnar part aggregate constituted by p columnar parts, wherein
the stacked body includes a plurality of the columnar part aggregates,
the p columnar parts each have a light emitting layer,
a diagram configured by respective centers of the p columnar parts has rotation symmetry, and a shape of the columnar part aggregate is not rotation symmetry, when viewed from a stacking direction of the stacked body, a diametrical size of q columnar parts out of the p columnar parts is different from a diametrical size of r columnar parts out of the p columnar parts,
the p is an integer not less than 2,
the q is an integer not less than 1 and less than the p, and
the r is an integer satisfying r=p−q.

2. A light emitting device comprising:
a substrate; and
a stacked body provided to the substrate, and including a columnar part aggregate constituted by p columnar parts, wherein
the stacked body includes a plurality of the columnar part aggregates,
the p columnar parts each have a light emitting layer,
when defining the p lattice points having rotation symmetry on the substrate, respective centers of q columnar parts out of the p columnar parts are disposed at the lattice points, respective centers of r columnar parts out of the p columnar parts are disposed at positions different from the lattice points, and a shape of the columnar part aggregate is not rotation symmetry, when viewed from a stacking direction of the stacked body,
the p is an integer not less than 3,
the q is an integer not less than 2 and less than the p, and
the r is an integer satisfying r=p−q.

3. The light emitting device according to claim 2, wherein the q is an integer larger than a half of the p.

4. A projector comprising:
the light emitting device according to claim 1.

* * * * *